United States Patent
Yamamoto

(10) Patent No.: US 9,428,828 B2
(45) Date of Patent: Aug. 30, 2016

(54) FILM FORMING METHOD, FILM FORMING APPARATUS AND CONTROL UNIT FOR THE FILM FORMING APPARATUS

(71) Applicant: CANON ANELVA CORPORATION, Kawasaki-shi (JP)

(72) Inventor: Shunsuke Yamamoto, Kawasaki (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 0 days.

(21) Appl. No.: 14/527,948

(22) Filed: Oct. 30, 2014

(65) Prior Publication Data

US 2015/0053547 A1   Feb. 26, 2015

Related U.S. Application Data

(60) Division of application No. 13/213,533, filed on Aug. 19, 2011, now abandoned, which is a continuation of application No. PCT/JP2011/051487, filed on Jan. 26, 2011.

(30) Foreign Application Priority Data

Jan. 26, 2010   (JP) ................................ 2010-014236

(51) Int. Cl.
  *C23C 14/34*   (2006.01)
  *C23C 14/22*   (2006.01)
  (Continued)

(52) U.S. Cl.
  CPC .......... *C23C 14/3492* (2013.01); *C23C 14/225* (2013.01); *C23C 14/35* (2013.01); *C23C 14/564* (2013.01); *H01J 37/3405* (2013.01); *H01J 37/3447* (2013.01)

(58) Field of Classification Search
  CPC . C23C 14/225; C23C 14/35; C23C 14/3492; H01J 37/3405; H01J 37/3447
  USPC ...................................................... 204/192.12
  See application file for complete search history.

(56) References Cited

U.S. PATENT DOCUMENTS 3,892,650 A   7/1975   Cuomo et al.
4,121,537 A   10/1978   Maruyama et al.
(Continued)

FOREIGN PATENT DOCUMENTS

JP   61-15966 A   1/1986
JP   63-230863 A   9/1988
(Continued)

OTHER PUBLICATIONS

Translation to Morita (JP 2009-068075) published Apr. 2009.*
(Continued)

*Primary Examiner* — John Brayton
(74) *Attorney, Agent, or Firm* — Fitzpatrick, Cella, Harper & Scinto

(57) ABSTRACT

The invention reduces generation of particles. An embodiment of the preset invention includes a target holder (6) for holding a target (4), a power source (12) for applying a power to the target holder (6), a substrate holder (7), a first shutter (14) capable of opening and closing between the target (4) and the substrate holder (7), a second shutter (19) located closer to the substrate holder (7) than to the first shutter (14), and capable of opening and closing between the target holder (6) and the substrate holder (7), and a controller (con) for controlling the power source (12) and the first and second shutters (14), (19). The controller (con) applies a first power to the target holder (6) in the state where the first shutter (14) is closed, then opens the first shutter (14), and further applies a second power higher than the first power to the target holder (6) in the state where the second shutter (19) is closed.

4 Claims, 2 Drawing Sheets

(51) Int. Cl.
  *C23C 14/35* (2006.01)
  *C23C 14/56* (2006.01)
  *H01J 37/34* (2006.01)

(56) References Cited

U.S. PATENT DOCUMENTS

| | | | |
|---|---|---|---|
| 4,410,407 A * | 10/1983 | Macaulay | C23C 14/564 |
| | | | 204/192.25 |
| 4,842,703 A * | 6/1989 | Class et al. | 204/192.12 |
| 4,911,809 A | 3/1990 | Wort et al. | |
| 5,174,875 A * | 12/1992 | Hurwitt et al. | C23C 14/345 |
| | | | 204/192.12 |
| 5,879,523 A | 3/1999 | Wang et al. | |
| 6,863,785 B2 | 3/2005 | Shidoji et al. | |
| 7,033,461 B2 | 4/2006 | Tani et al. | |
| 7,247,345 B2 | 7/2007 | Takahashi et al. | |
| 8,147,664 B2 | 4/2012 | Yamaguchi et al. | |
| 2006/0191876 A1 | 8/2006 | Brown et al. | |
| 2006/0249372 A1 | 11/2006 | Xiang et al. | |
| 2007/0227876 A1* | 10/2007 | Shamoun | 204/192.1 |
| 2009/0148595 A1 | 6/2009 | Nagamine et al. | |
| 2009/0211897 A1* | 8/2009 | Tsunekawa | 204/192.13 |
| 2010/0224482 A1 | 9/2010 | Yamaguchi et al. | |
| 2010/0326818 A1 | 12/2010 | Ikemoto et al. | |

FOREIGN PATENT DOCUMENTS

| | | |
|---|---|---|
| JP | 63-290271 A | 11/1988 |
| JP | 1-139763 A | 6/1989 |
| JP | 2-173258 A | 7/1990 |
| JP | 4-99271 A | 3/1992 |
| JP | 4-218671 A | 8/1992 |
| JP | 7-48668 A | 2/1995 |
| JP | H07-116602 B2 | 12/1995 |
| JP | 8-104975 A | 4/1996 |
| JP | 8-269705 A | 10/1996 |
| JP | 2003-183824 A | 7/2003 |
| JP | 2009-65181 A | 3/2009 |
| JP | 2009068075 A * | 4/2009 |

OTHER PUBLICATIONS

International Preliminary Report on Patentability issued in PCT/JP2011/051487, dated Sep. 27, 2012 (6 pages).

Extended European Search Report issued in EP 11 737 047.8 dated Jul. 4, 2013 (7 pages).

Office Action issued in Korean Patent Application No. 10-2012-7017552, dated Nov. 6, 2013 (11 pages).

* cited by examiner

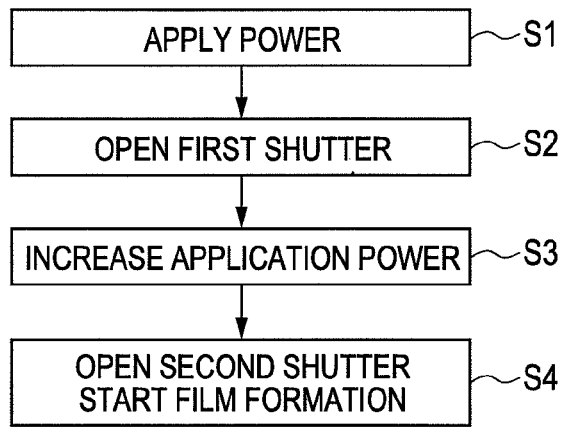
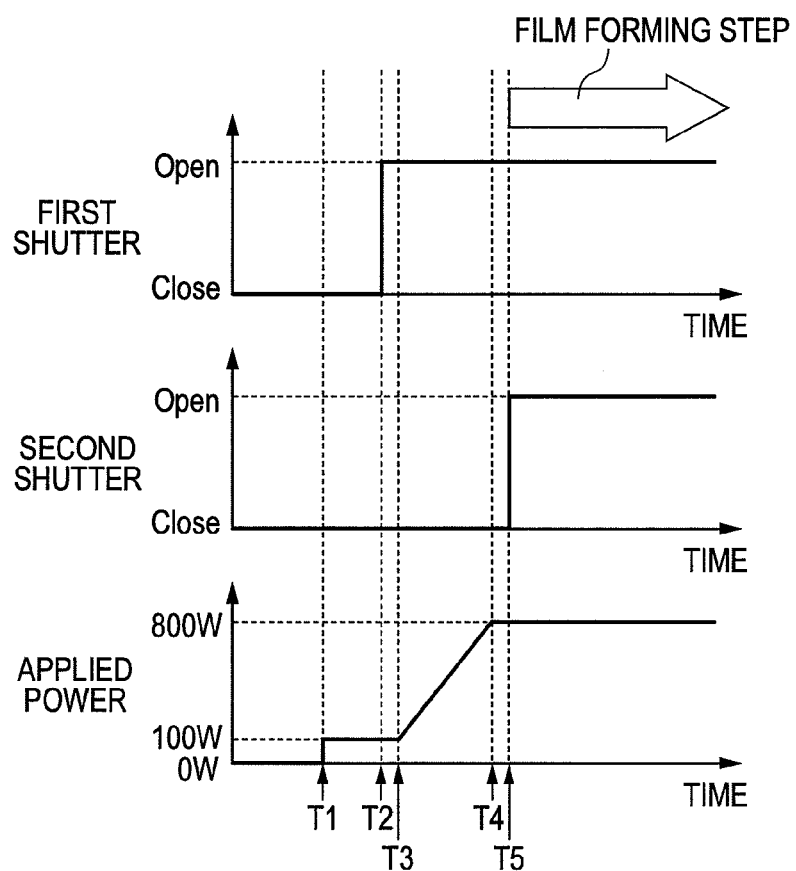

FILM FORMING METHOD, FILM FORMING APPARATUS AND CONTROL UNIT FOR THE FILM FORMING APPARATUS

CROSS-REFERENCES TO RELATED APPLICATIONS

This application is a divisional application of U.S. application Ser. No. 13/213,533, filed Aug. 19, 2011, which is a continuation application of International Application No. PCT/JP2011/051487, filed Jan. 26, 2011, which claims the benefit of Japanese Patent Application No. 2010-014236, filed Jan. 26, 2010. The contents of the aforementioned applications are incorporated herein by reference in their entireties.

TECHNICAL FIELD

The present invention relates to a film forming method and a film forming apparatus (for example, sputtering apparatus) employed for depositing material on a substrate in the step of manufacturing a semiconductor device and a magnetic storage medium, and a control unit for the film forming apparatus.

BACKGROUND ART

The practice for producing the thin film using sputtering phenomenon and processing the thin film for application to the device has been widely implemented in the industry. The sputtering phenomenon is caused by making high energy ion incident onto the target from which sputter particles (neutral particles) are generated, so that the sputter particles are deposited on the substrate.

Generally, the sputtering film forming apparatus is provided with a shield called shutter capable of opening and closing between the target and the substrate. The shutter is used to control the timing for starting the film formation so as not to start the film forming process until stabilization of the plasma state within the vacuum vessel. Specifically, the shutter is kept closed until stabilization of the plasma generated upon application of high voltage to the target so that no film is formed on the substrate. Upon stabilization of the plasma, the shutter is opened to start the film formation. Controlling start of the film formation using the shutter makes it possible to conduct well controlled film formation on the substrate with stabilized plasma, resulting in the film with high quality.

Patent Document 1 discloses the high frequency sputtering apparatus and method capable of forming the thin film with excellent reproducibility with respect to the film quality and film thickness by opening the shutter disposed between the substrate and the target upon stabilization of self bias while detecting the self bias voltage induced in the target. Patent Document 2 discloses the sputtering apparatus having the sputter cathode provided with a tubular cathode cover which surrounds the side of the sputter surface, and the shutter that can be opened and closed provided in the open end portion of the cathode cover. The sputtering apparatus disclosed in Patent Document 2 is capable of reducing turnaround of the sputter particles upon discharge in the state where the shutter is closed before starting the film formation such as the target cleaning.

RELATED ART

Patent Document

[Patent Document 1] Japanese Unexamined Patent Application Publication No. 4-218671
[Patent Document 2] Japanese Unexamined Patent Application Publication No. 8-269705

SUMMARY OF INVENTION

The sputtering film forming apparatus and method disclosed in Patent Document 1 allow formation of the thin film with excellent reproducibility with respect to film quality and film thickness by opening the shutter disposed between the substrate and the target at a time point when the self bias is stabilized. However, reduction of the particle onto the substrate is not disclosed in the document. The film forming apparatus disclosed in Patent Document 2 has also improved the turnaround of the sputter particles when the shutter is closed. However, the problem relevant to the particle onto the substrate resulting from formation of the film when the shutter is opened is not described. Influence of the particle on production of the semiconductor device and the magnetic storage medium adapted for recent miniaturization and thin-film formation has increased, and accordingly, suppression of the particle has been increasingly demanded.

A first aspect of the present invention is a film forming method for forming a film on a substrate by sputtering a target, the method comprising: a first step of applying a first power to a target holder holding the target to cause discharge in a first discharge space, the first power being lower than a film forming power applied upon film formation from a power source connected to the target holder; a second step of changing the location of discharging from the first discharge space to a second discharge space larger than the first discharge space while continuing the discharge caused in the first step; a third step of applying a second power higher than the first power to the target holder from the power source in the second discharge space; and a fourth step of exposing the substrate, which is shielded against the second discharge space, to the second discharge space.

A second aspect of the present invention is a film forming apparatus comprising: a target holder for holding a target; a power applying means for applying a power to the target holder; a substrate holder for holding a substrate; a shield which is grounded, has a hollow portion formed so as to surround the target holder, and has an opening formed for causing the hollow portion to communicate with outside the shield; a first shielding member configured to be movable between a first position that shields between the target holder and the substrate holder by covering the opening and a second position that does not shield between the target holder and the substrate holder; a second shielding member configured to be movable between a third position that shields between the target holder and the substrate holder by covering at least a substrate holding surface of the substrate holder and a fourth position that does not shield between the target holder and the substrate holder; and a control means for controlling the power applying means and movement of the first and second shielding members, wherein the control means controls the power applying means so as to apply a first power lower than a film forming power applied to the target holder upon film formation in a state where the first shielding member is located at the first position and the second shielding member is located at the third position, then controls movement of the first shielding member so as to move the first shielding member from the first position to the second position in a state where the second shielding member is located at the third position, and then controls the power applying means so as to apply a second power higher than the first power to the target holder.

A third aspect of the present invention is a control unit for controlling a film forming apparatus provided with a target holder for holding a target, a power applying means for applying a power to the target holder, a substrate holder for holding a substrate, a shield which is grounded, has a hollow portion formed so as to surround the target holder, and has an opening for causing the hollow portion to communicate with outside the shield; a first shielding member configured to be movable between a first position that shields between the target holder and the substrate holder by covering the opening and a second position that does not shield between the target holder and the substrate holder; and a second shielding member configured to be movable between a third position that shields between the target holder and the substrate holder by covering at least a substrate holding surface of the substrate holder and a fourth position that does not shield between the target holder and the substrate holder, the control unit comprising: a means for controlling the power applying means so as to apply a first power lower than a film forming power applied to the target holder upon film formation in a state where the first shielding member is located at the first position and the second shielding member is located at the third position; a means for controlling movement of the first shielding member so as to move the first shielding member from the first position to the second position in a state where the second shielding member is located at the third position by applying the first power to the target holder while continuing discharge caused in a first discharge space between the hollow portion and the first shielding member; and a means for controlling the power applying means so as to apply a second power higher than the first power to the target holder in a state where the first shielding member is located at the second position and the second shielding member is located at the third position.

The present invention makes it possible to realize reduction of the particle onto the substrate upon film formation.

BRIEF DESCRIPTION OF THE DRAWINGS

FIG. 2 is a flow of a film forming method according to an embodiment of the present invention.

FIG. 3 is a chart representing each state of components resulting from application of the film forming method according to an embodiment of the present invention.

DESCRIPTION OF EMBODIMENTS

Figure 1:
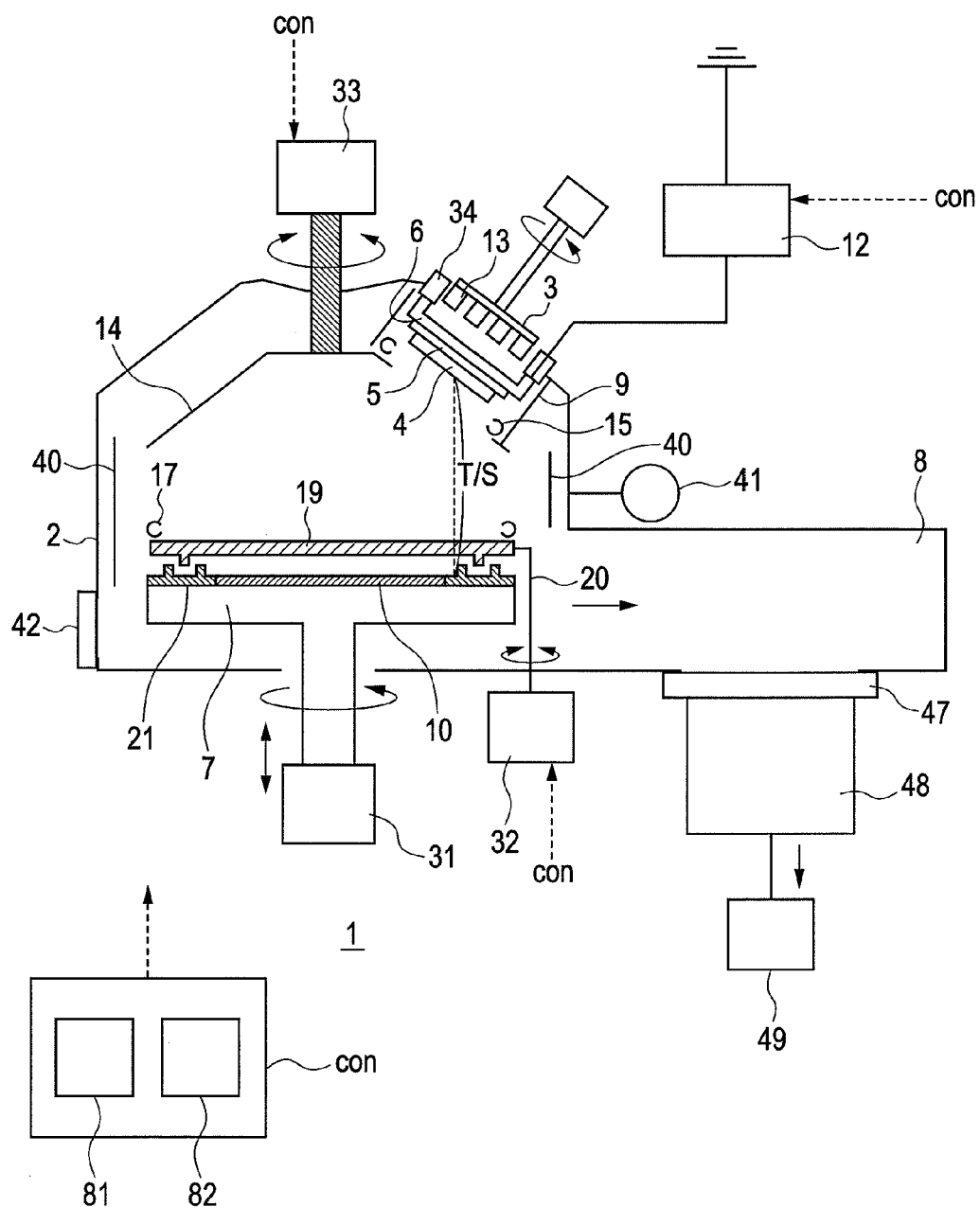
FIG. 1 schematically illustrates a sputtering apparatus according to an embodiment of the present invention.

Referring to FIG. 1, a general structure of a sputter film forming apparatus 1 according to an embodiment of the present invention will be described. FIG. 1 schematically illustrates the sputtering apparatus 1 according to an embodiment of the present invention.

The sputter film forming apparatus 1 includes a vacuum chamber 2 provided with a gate valve 42 and capable of vacuum exhaust, an exhaust chamber 8 which is provided adjacent to the vacuum chamber 2 via an exhaust port, and an exhaust unit for exhausting the inside of the vacuum chamber 2 via the exhaust chamber 8. The exhaust unit includes a turbo-molecular pump 48 connected to the exhaust chamber 8 via a main valve 47. The turbo-molecular pump 48 of the exhaust unit is further connected to a dry pump 49. The exhaust unit is provided below the exhaust chamber 8 in order to minimize the footprint (occupied area) of the apparatus as a whole.

A target holder 6 is provided within the vacuum chamber 2 for holding a target 4 via a back plate 5. Adjacent to the target holder 6, a target shutter 14 with an opening is provided so as to cover the target holder 6. The target shutter 14 formed of a conductive metal, for example, Al and SUS, is grounded. The target shutter 14 has a rotary shutter structure. The target shutter 14 functions as a shielding member that changes a state between a closed state (shielded state) for shielding between a substrate holder 7 and the target holder 6, and an open state (retracted state) for not shielding between the substrate holder 7 and the target holder 6. When the target shutter 14 is located at a first position that shields between the target holder 6 and the substrate holder 7, the target shutter 14 is in the closed state. When the target shutter 14 is located at the first position, an opening of a chimney 9 (an opening for connecting the hollow portion of the chimney 9 with outside the chimney 9) is covered with the target shutter 14, so that the target holder 6 is shielded against the substrate holder 7. Meanwhile, when the target shutter 14 is located at a second position that does not shield between the target holder 6 and the substrate holder 7, it is in the open state.

The opening of the target shutter 14 is positioned between the target 4 placed on the target holder 6 and a substrate 10 mounted on the substrate holder 7 to bring the target shutter 14 into the open state. The target shutter 14 is provided with a target shutter drive mechanism 33 for opening and closing the target shutter 14. The chimney 9 as a tubular shield is provided around the target holder 6 in the space between the target holder 6 and the target shutter 14 so as to surround periphery of the target holder 6. A magnetron discharge space to the front of the sputter surface of the target 4 attached to the target holder 6 is surrounded with the chimney 9, and open to the opening of the target shutter 14 in the open state of the shutter.

In the embodiment, the target shutter 14 is configured to be rotatable. However, the target shutter 14 may be arbitrarily configured so long as it is movable between the first and the second positions so as to establish its closed state and the open state. For example, the target shutter 14 may be configured to be slidable and may be moved between the first and second positions by sliding.

If the magnetron discharge space to the front of the sputter surface of the target 4 attached to the target holder 6 is surrounded with the chimney 9 and the gas introducing mechanism is further provided toward the magnetron discharge space, gas is introduced while bringing the target shutter 14 into the closed state so as to immediately raise the pressure to the front surface of the target. This makes it possible to quickly start discharging under the low pressure, thus providing the effect for improving throughput.

The sputter apparatus of off-set arrangement in the present embodiment, intended to obtain good distribution in spite of a very thin film allows use of a plurality of targets so as to be switchable. In this case, the target shutter 14 and the chimney 9 are used for the purpose of preventing or suppressing cross contamination of the plurality of targets. That is, the target shutter 14 in this case serves to shield the other target holder from the discharge space (space where the plasma discharge occurs) between the target holder 6 and the substrate holder 7 in the open state.

The chimney 9 is formed of the conductive material, for example, Al, and grounded. Preferably, the chimney 9 has concavo-convex portions formed on its surface facing the target through blast process and thermal spray from the aspect of retaining the adhered sputter particles. It is more preferable to coat the surface of the chimney 9, which faces the target with at least the insulating material, for example, alumina and yttria through thermal spray. The surface of the chimney 9 as the member for surrounding the target 4, which faces the target 4 is coated through at least alumina thermal spray, so that the surface potential of the chimney 9 becomes close to the plasma potential compared to the case where it is not coated through alumina thermal spray. In other words, the surface of the chimney 9, which faces the target is coated with at least the insulating film (for example, insulating film formed through alumina thermal spray) so as to allow the surface potential of the chimney 9 to be close to the potential of plasma generated in the magnetron discharge space in the structure capable of forming the magnetron discharge space in the hollow portion of the chimney 9. This may suppress bombardment by the charged particles in plasma, thus further reducing the particles. The surface of the chimney 9, which faces the target, is coated through at least the alumina thermal spray to suppress abnormal discharge generated between the chimney 9 and the target 4, thus further reducing the particles. When the surface of the chimney 9, which faces the target, is coated through thermal spray of the insulating film with arbitrary method other than the one according to the embodiment, the result of remarkable particle reduction has been obtained compared to the case where the chimney surface is merely coated through the metal thermal spray. According to the embodiment, a film forming method for forming a film on a substrate by sputtering a target includes a first step of causing discharge in a first discharge space by applying a first power to a target holder for holding the target, the first power being lower than a film forming power applied upon film formation by a power source connected to the target holder, a second step of changing the location of discharging from the first discharge space to a second discharge space larger than the first discharge space while continuing the discharge caused in the first step, a third step of applying a second power higher than the first power to the target holder from the power source in the second discharge space, and a fourth step of exposing the substrate shielded against the second discharge space to the second discharge space. The effect of the particle reduction may not be limited to the case by the aforementioned method. The particle reduction effect may be obtained when the surface of the chimney 9, which faces the target 4, is coated through at least the insulating film thermal spray in the structure capable of forming the magnetron discharge space in the hollow portion of the chimney 9. The above-described method may further be combined with the power application method according to the embodiment so as to obtain more remarkable effects.

A magnet 13 for realizing magnetron sputtering is provided to the rear of the target 4 when seen from the sputter surface. The magnet 13 held by a magnet holder 3 is rotatable by a not shown magnet holder rotating mechanism. During discharge, the magnet 13 is rotated for making erosion of the target uniform. The target 4 is provided at a position (offset position) obliquely upward with respect to the substrate 10. In other words, the center point of the sputter surface of the target 4 deviates from the normal of the center point of the substrate 10 by a predetermined dimension. The target holder 6 is connected to a power source 12 for applying power for sputter discharge. When the power source 12 applies voltage to the target holder 6, discharge starts to deposit sputter particles on the substrate. Assuming that the distance between the point at which the plane that includes the upper surface of the substrate holder 7 intersects the normal of the plane that passes the center point of the target 4, and the center point of the target 4 is defined as T/S distance (see FIG. 1), the T/S distance of the embodiment is set to 240 mm. As RF power source is used as the power source, a not shown matching box is provided between the power source 12 and the target holder 6.

The target holder 6 is insulated by an insulator 34 from the vacuum chamber 2 at the ground potential. It is formed of a metal such as Cu which serves as the electrode upon application of power. The target holder 6 is provided with a not shown water path inside so as to be cooled by cooling water supplied from a not shown water pipe arrangement. The target 4 contains the material component intended to be used for forming a film on the substrate 10.

The back plate 5 provided between the target 4 and the target holder 6 is formed of a metal such as Cu, and supports the target 4.

A substrate holder 7 for mounting the substrate 10 thereon, and a substrate shutter 19 provided between the substrate holder 7 and the target holder 6 are provided within the vacuum chamber 2. The substrate shutter 19 is supported by a substrate shutter support mechanism 20 which is connected to a substrate shutter drive mechanism 32 for driving the substrate shutter 19 to be opened and closed. The substrate shutter 19 provided adjacent to the substrate holder 7 serves as a shielding member for switching a state between a closed state for shielding between the substrate holder 7 and the target holder 6 and an open state for not shielding between the substrate holder 7 and the target holder 6. That is, when the substrate shutter 19 is located at a third position that shields between the target holder 6 and the substrate holder 7, the substrate shutter 19 is in the closed state. When the substrate shutter 19 is located at the third position, it covers at least the substrate holding surface on which the substrate of the substrate holder 9 is held. The substrate 10 is shielded against the side of the target shutter 14 (for example, second discharge space to be described later). Meanwhile, when the substrate shutter 19 is located at a fourth position that does not shield between the target holder 6 and the substrate holder 7, it is in the open state.

In the embodiment, the substrate shutter 19 is configured to be rotatable. However, the substrate shutter 19 may be arbitrarily configured so long as it is movable between the third and fourth positions so as to establish its closed/open states. For example, the substrate shutter 19 may be configured to be slidable and may be moved between the third and fourth positions by sliding.

The inner surface of the vacuum chamber 2 is grounded. A grounded chamber shield 40 is provided on the inner surface of the vacuum chamber 2 between the target shutter 14 and the substrate holder 7. The chamber shield is formed separately from the vacuum chamber 2 for preventing direct adhesion of sputter particles discharged from the target 4 onto the inner surface of the vacuum chamber 2, and for protecting the inner surface of the vacuum chamber. The chamber shield may be periodically replaced and cleaned for reuse. The chamber shield 40 is positioned to surround at least the space between the opening of the target shutter 14 and the position which can be shielded by the substrate shutter 19. The grounded chamber shield 40 is capable of acting as a ground electrode to the target 4 and the target holder 6 to which the high frequency power is applied. Further preferably, the chamber shield 40 is positioned to surround the space between the opening of the target shutter 14 and the substrate holder 7 from the aspect of stability of plasma.

A ring-like shielding member (hereinafter referred to as "substrate peripheral cover ring 21") is provided on the surface of the substrate holder 7 at outer edge side (outer circumference) of the portion on which the substrate 10 is mounted. The substrate peripheral cover ring 21 prevents or suppresses adhesion of the sputter particles to the portion of the substrate 10 mounted on the substrate holder 7 other than the film forming surface. The portion other than the film forming surface includes the side surface and back surface of the substrate 10 in addition to the surface of the substrate holder 7 covered by the substrate peripheral cover ring 21. The substrate holder 7 is provided with a substrate holder drive mechanism 31 for moving the substrate holder 7 up and down and rotating it at a predetermined speed. The substrate holder drive mechanism 31 is capable of moving the substrate holder 7 up and down.

The vacuum chamber 2 is provided with a first gas inlet 15 for introducing inert gas into the vacuum chamber 2, a second gas inlet 17 for introducing reactive gas, and a pressure gauge 41 for measuring pressure of the vacuum chamber 2. The first gas inlet 15 is connected to piping for introducing the inert gas (for example, argon, krypton, xenon, neon), a mass flow controller for controlling flow rate of the inert gas, and valves for switching on/off state of flow of the inert gas, and configured to introduce the gas at the flow rate designated by a not shown control unit into the vacuum chamber 2 stably. The first gas inlet 15 may be connected to a decompression valve, filter and the like when needed. The first gas inlet 15 is positioned adjacent to the target 4. The first gas inlet 15 is configured to introduce the inert gas into the magnetron discharge space to the front surface of the target 4.

The second gas inlet 17 is connected to piping for introducing reactive gas (for example, nitrogen, oxygen), the mass flow controller for controlling the flow rate of the reactive gas, and valves for switching on/off state of flow of the reactive gas, and configured to introduce the gas at the flow rate designated by a not shown control unit into the vacuum chamber 2 stably. The second gas inlet 17 may be connected to a decompression valve, filter and the like when needed. The second gas inlet 17 is positioned adjacent to the substrate 10.

The sputter film forming apparatus 1 is provided with a controller con as a control means for controlling the drive mechanisms 32, 33 for the shutters 14, 19 and the power source 12 so as to open/close the shutters 14, 19 at a predetermined timing to increase/decrease the power. The controller con of the sputter film forming apparatus 1 includes a storage unit 81 for storing the program of the method according to the embodiment as shown in FIG. 2, for example, and an arithmetic processing unit 82 for executing the arithmetic processing of the process control. The controller con is capable of executing the method according to the embodiment in accordance with the program shown in FIG. 2. The arithmetic processing unit 82 may be formed of a personal computer (PC), PLC, and microcomputer, for example.

FIG. 2 represents an exemplary flow of the film forming method according to the embodiment. FIG. 3 represents the respective states of components (timing chart) when applying the method. Referring to FIGS. 2 and 3, the film forming method according to the embodiment using the apparatus as shown in FIG. 1 will be described.

First, the target shutter 14 (which may be referred to as "first shutter") is in the closed state. That is, the target shutter 14 is located at the first position. So if the target shutter 14 is in the open state, the controller con controls the target shutter drive mechanism 33 to rotate the target shutter 14 into the closed state so as to shield between the target holder 6 and the substrate holder 7. In the embodiment, the target holder 6 is surrounded with the chimney 9, so that the space defined by the target shutter 14, the chimney 9 and the target 4 in the closed state serves as the first discharge space. The first discharge space is made smaller than the discharge space upon subsequent film formation (second discharge space to be described later) to promote discharging at ignition.

The substrate shutter 19 (which may be also referred to as "second shutter") is also closed. That is, the substrate shutter 19 is located at the third position. While the substrate shutter 19 is in the open state, the controller con controls the substrate shutter drive mechanism 32 to rotate the substrate shutter 19 into the closed state so as to shield between the target holder 6 and the substrate holder 7.

In first step S1, the controller con controls the power source 12 to apply a first power (electric power) to the target holder 6 for holding the target 4. Application of the first power causes discharge in the first discharge space. The power (first power) applied in first step S31 may be lower than the film forming power so long as the discharge is stably started. In second step S2, the controller con controls the target shutter drive mechanism 33 to open the first shutter (target shutter 14) capable of switching open/closed state between the target 4 and the substrate 10 while continuing the discharge with power applied in first step S1. That is, the target shutter drive mechanism 33 rotates the first shutter so as to move the first shutter from the first position to the second position. The target holder 6 (target 4) is exposed to the side of the substrate holder 7 (the target shutter 14 is brought into the open state). The target shutter 14 is thus brought into the open state to allow discharge also in the region between the target holder 6 and the substrate holder 7 in the vacuum chamber 2, for example. Second step S2 changes the location of discharging from the first discharge space to the second discharge space larger than the first discharge space.

In third step S3, the controller con controls the power source 12 to increase the power applied to the target holder 6 from the first power to a second power higher than the first power. It is preferable to increase the power applied in third step S3 (second power) to a film forming power for stable film formation on the next substrate. Then in fourth step S4, the controller con controls the substrate shutter drive mechanism 32 to open the second shutter (substrate shutter 19) which can be opened/closed at the position closer to the substrate 10 than to the first shutter (target shutter 14) for starting the film formation on the substrate 10. That is, the substrate shutter drive mechanism 32 rotates the second shutter so as to move the second shutter from the third position to the fourth position for exposing the substrate holder 7 (that is, the substrate 10) to the side of the target holder 6 (substrate shutter 19 is brought into the open state). The substrate holder 7 is thus brought into the open state to expose the substrate holder 7 (that is, substrate 10) to the second discharge space. This allows the sputter particles to reach the substrate 10 on which the film is formed.

The aforementioned flow of the film forming process allows remarkable reduction in the particles.

The flow for starting the film forming process, and background of the remarkable particle reduction as a result of such process will be described.

In the state where the discharge space to the front of the target 4 is surrounded with the chimney 9 to make it advantageous to start discharging, and the first shutter (target shutter 14) is closed, gas is introduced into the discharge space (first discharge space) to start discharging through application of high frequency power to the target holder 6. In the aforementioned state, the plasma is confined by the target 4, the chimney 9 and the target shutter 14. As it is well known, even if the target is formed of the insulating material, high frequency propagates to generate plasma and self bias voltage. In the embodiment, since the chimney 9 and the target shutter 14 are grounded, the chimney 9 and the target shutter 14 serve as the ground electrodes. As the target shutter 14 is configured to be rotatable by the drive mechanism, the chimney 9 may be considered to be grounded, which does not have to be completely grounded at high frequency.

In this specification, the area of the surface of the target 4 facing the plasma via the sheath is set as high frequency applied electrode area. When starting the discharge while closing the target shutter 14 as described above, the grounded electrode area is set as the total area of the inner wall surface of the chimney 9 and the surface of the target shutter 14 facing the target 4 at a maximum. In this way, if the grounded electrode area is relatively small to the high frequency applied electrode area, the unignorable voltage may be applied not only to the target 4 but also to the chimney 9 and the target shutter 14. The voltage in this case is caused by the potential difference between the plasma potential and the electrode.

As the grounded electrode area becomes larger relative to the high frequency applied electrode area, the potential difference between the plasma potential and the ground electrode becomes smaller. Meanwhile, if the grounded electrode area becomes close to the high frequency applied electrode area, the voltage that is substantially the same voltage applied to the high frequency applied electrode (target 4 in this case) may be also applied to the ground electrode. If the target shutter 14 is opened (the target shutter 14 is brought into the open state), the plasma is diffused in the region between the target shutter 14 and the chamber shield 40. While the high frequency applied electrode area is kept constant, the grounded electrode area in view of plasma largely changes depending on the state where the target shutter 14 is closed (closed state), and the state where it is opened (open state). In other words, in the embodiment, the relationship of "high frequency applied electrode area/grounded electrode area" becomes "closed target shutter 14 (closed state)>opened target shutter 14 (open state)". Increase in the grounded electrode area relative to the high frequency applied electrode area is effective for decreasing the voltage to the ground electrode.

In case of large potential difference between the chimney 9 and plasma, ion in the plasma is made incident onto the inner surface of the chimney 9 in accordance with the potential difference between the chimney 9 and the plasma. If the potential difference is large, ions incident onto the inner surface of the chimney 9 sputter the surface of the chimney 9 and the surface of the target shutter 14 facing the target to generate particles.

When starting discharge in the state where the target shutter 14 is closed (second step S2), the relatively small first discharge space is formed. The ground electrode becomes the chimney 9 and the target shutter 14 for comparting the first discharge space. Accordingly, the grounded electrode area becomes relatively small to the high frequency applied electrode area. However, if discharge is started under the applied electric power (power) as the first power as low as possible, the potential difference between the chimney 9 as the ground electrode and the plasma generated in the first discharge space may be made small. This makes it possible to reduce particle generation owing to ion bombardment against the surface of the chimney 9 and the surface of the target shutter 14 facing the target.

Meanwhile, even if the applied power is increased after opening the target shutter 14 (in third step S3), particles are not increased. That is, when the target shutter 14 is in the open state, the ground electrode includes the chimney 9, the target shutter 14 and the chamber shield 40. When bringing the target shutter 14 into the open state, the high frequency applied electrode area is not changed. The discharge space becomes the second discharge space larger than the first discharge space, thus making the grounded electrode area large. This makes it possible to reduce the potential difference between the plasma potential and the ground electrode potential. This may further prevent incidence of the ion with the energy which may cause problem on the inner surface of the chimney 9 and the surface of the chamber shield 40. When opening the substrate shutter 19 that has been in the closed state, the change in the grounded electrode area ratio to the high frequency applied electrode area is not as large as the case where the target shutter 14 that has been in closed state is opened. Accordingly, the problem relevant to increase in particles hardly occurs.

The embodiment describes the sputter apparatus with offset arrangement. However, such condition is not necessarily required for obtaining the effect of the present invention. The effect of the present invention may be obtained when establishing the conditions where at least two shielding members (for example, shutters) are needed, and at least one of the shielding members is provided adjacent to the target, and at least one of the other shielding members is provided adjacent to the substrate. Particularly, in case of the long throw sputtering having long distance between the target and the substrate, the distance between the shielding member near the target and the shielding member near the substrate, or the distance between the shielding member near the target and the substrate mounted on the substrate holder becomes large. As the ground area largely changes when opening the shielding member near the target, great effect may be obtained.

The shield (for example, chimney) provided for the shielding member (for example, shutter) near the target at the target side is advantageous for improving start of discharge and suppression of the cross contamination. The configuration of the shield is not limited to the one described in the embodiment so long as the function is ensured. That is, the shield such as the chimney may be an arbitrary member so long as it surrounds the target holder, which includes a hollow portion and an opening for causing the hollow portion to communicate with the outside, and is allowed to be grounded. The opening is selectively shielded by the shielding member such as the target shutter.

The applied power when changing the target shutter 14 from the closed state to the open state is an essential factor because the smaller the applied power becomes, the more the particles may be suppressed. It is thought to be related to the change in the plasma state which becomes large as the applied power is large when changing the state of the target shutter 14 in the closed state to the open state.

Referring to the timing chart of FIG. 3, the horizontal axis represents time, and the vertical axis represents the open/closed state of the first shutter, open/closed state of the second shutter, and the applied power state from the power source 12 to the target holder 6.

At a time T1, the first power (for example, 100 W) lower than the film forming power (second power), which allows stable start of discharge is applied (first step S1). Then at a time T2, the first shutter is opened (second step S2). The first power applied at the time T2 has to be lower than the second power as the film forming power, which allows stable start of discharge for the purpose of suppressing particles. Then the applied power is increased to the second power from the time T3 to T4 (third step S3). Preferably, the second power is set as the film forming power (for example, 800 W) used in the film forming step. At a time T5, the second shutter is opened to start the film forming step (fourth step S4).

Preferably, the applied power is increased in third step S3 (from time T3 to T4) stepwise or continuously at low rates. The stepwise or continuous increase in the power at low rates allows reduction in the load to the power source 12, and further allows the matching box to stably perform matching. Impedance of the plasma is different between the low power and high power. So the matching box needs to have different parameters, respectively. The parameters may be adjusted generally by automatically changing the variable capacitor capacity by way of hardware. When the power is largely changed, the change of the variable capacitor capacity is also increased, which may cause the time lag until the optimum value, thus making the plasma unstable. Especially in such a case, it is preferable to increase the applied power stepwise or continuously at low rates. The period required for the increase at low rates may be arbitrarily set so long as it is in the range allowed by the product throughput, and the performance of the matching box is allowed to follow up.

It is essential to cause discharge while suppressing particle generation in the first discharge space, and not to increase the potential difference between the ground electrode potential and the plasma potential in first step S1. So the first power may be arbitrarily set so long as it is low enough to allow stable start of discharge, and not to largely increase the potential difference. If the aforementioned requirements are satisfied, the first power may be stepwise or continuously increased or decreased in the period from the time T1 to T2 in FIG. 3.

Example

The apparatus shown in FIG. 1 was employed to perform RF sputtering using $Al_2O_3$ as the target, and the chimney (tubular shield) 9 having the surface facing the target and coated through alumina thermal spray. Argon was used as the inert gas which is introduced from the first gas inlet 15. The RF power (second power) for forming the film on the substrate 10 was set to 800 W. The power for starting power application (first power) was set to 100 W. After applying the power of 100 W (first power) (first step S1), the first shutter was opened (second step S2). After opening the first shutter, the applied power was increased to 800 W (second power) upon formation of the substrate (third step S3). After increasing the power, the second shutter was opened, and film formation on the substrate was started (fourth step S4). In the example, the number of particles on the substrate having the film formed thereon counted 19, indicating reduction of the number of particles relative to the comparative example to be described later.

Comparative Example

Likewise the example as described above, RF sputtering was performed using $Al_2O_3$ as the target, and the chimney (tubular shield) 9 having the surface facing the target and coated through alumina thermal spray. Argon was used as the inert gas likewise the aforementioned example. The RF power for forming the film on the substrate 10 was set to 800 W. After setting the RF power to 800 W, and applying the power, the first shutter was opened, and then the second shutter was opened to form the film. The number of particles on the substrate having the film formed thereon counted 496.

Other Example

According to the present invention, the controller con as the control unit for the sputter film forming apparatus 1 may be built in the sputter film forming apparatus 1, or provided separately from the sputter film forming apparatus 1. When it is separately provided, the controller con and the sputter film forming apparatus 1 may be locally connected through LAN, or connected with wire or wirelessly connected via WAN connection such as the Internet, so that the controller con is configured to be communicated with the sputter film forming apparatus 1.

The processing method configured to store the program for operating the structure of the embodiment to realize the functions as described above in the storage medium, read the program stored in the storage medium as codes, and execute the operations by the computer is also included in the scope of the above embodiment. In other words, the computer readable data storage medium is also within the range of the example. Naturally, the storage medium for storing the computer program and the computer program itself may be included in the range of the example.

For example, Floppy™ disk, hard disk, optical disk, magnetic optical disk, CD-ROM, magnetic tape, nonvolatile memory card, and ROM may be employed as the data storage medium.

Besides execution of the process by the program by itself stored in the aforementioned storage medium, the other one which is operated on OS in association with the other software and add-in board function may be included in the category of the aforementioned embodiment.

The invention claimed is:

1. A film forming method for forming a film on a substrate by sputtering a target using a film forming apparatus comprising a chamber shield that is grounded and disposed on an inner surface of a vacuum chamber: a target holder that is disposed in the vacuum chamber holding the target; a substrate holder that is disposed in the vacuum chamber so as to face the target holder and having a substrate holding surface for holding the substrate; a first shielding member that is disposed in an upper part of the chamber shield and in a vicinity of the target holder, and having an opening; and a second shielding member that is disposed in a lower part of the chamber shield and in a vicinity of the substrate holder, the method comprising:

a first step of applying a first power to the target holder to cause discharge in a first discharge space that is formed when the first shielding member is located at a first position, at a same time with shielding the substrate by locating the second shielding member at a third position such that the second shielding member covers the substrate holding surface on which the substrate is held, the first power being lower than a film forming power applied upon film formation from a power source connected to the target holder, the first shielding member being movable between the first position that shields between the target holder and the substrate holder and a second position that does not shield between the target holder and the substrate holder, the second shielding member being movable between the third position that shields between the target holder and the substrate holder and a fourth position that does not shield between the target holder and the substrate holder;

a second step of changing a location of discharging from the first discharge space to a second discharge space larger than the first discharge space by moving the first shielding member from the first position to the second position such that the opening of the first shielding member makes the target and the second discharge space communicate with each other, while continuing the discharge caused in the first step and locating the second shielding member at the third position such that the second shielding member covers the substrate holding surface;

a third step of applying a second power higher than the first power to the target holder from the power source in the second discharge space, while locating the first shielding member at the second position such that the first shielding member does not shield between the target holder and the substrate holder, and locating the second shielding member at the third position such that the second shielding member covers the substrate holding surface; and a fourth step of exposing the substrate, which is shielded against the second discharge space by the second shielding member, to the second discharge space by moving the second shielding member from the third position to the fourth position such that the second shielding member does not cover the substrate holding surface, while locating the first shielding member at the second position such that the first shielding member does not shield between the target holder and the substrate holder.

2. The film forming method according to claim 1,
wherein the first discharge space is formed of a space surrounded by the first shielding member that is grounded, and the target holder, when the first shielding member is located at the first position; and
wherein the second discharge space is formed of a space surrounded by the target holder, the first shielding member that is grounded, the chamber shield, and the second shielding member, when the first shielding member is moved from the first position to the second position and the second shielding member is located at the third position.

3. The film forming method according to claim 1, wherein in the third step, the power applied to the target holder is increased stepwise or continuously.

4. The film forming method according to claim 1, wherein after the fourth step, the film is continuously formed on the substrate.

* * * * *